(12) United States Patent
Brueck

(10) Patent No.: US 9,356,216 B2
(45) Date of Patent: May 31, 2016

(54) SEMICONDUCTOR ELEMENT FOR A THERMOELECTRIC MODULE, METHOD FOR PRODUCING THE SEMICONDUCTOR ELEMENT AND THERMOELECTRIC MODULE

(71) Applicant: EMITEC GESELLSCHAFT FUER EMISSIONSTECHNOLOGIE MBH, Lohmar (DE)

(72) Inventor: Rolf Brueck, Bergisch Gladbach (DE)

(73) Assignee: EMITEC GESELLSCHAFT FUER EMISSIONSTECHNOLOGIE MBH, Lohmar (DE)

( * ) Notice: Subject to any disclaimer, the term of this patent is extended or adjusted under 35 U.S.C. 154(b) by 406 days.

(21) Appl. No.: 13/775,795

(22) Filed: Feb. 25, 2013

(65) Prior Publication Data
US 2013/0160807 A1   Jun. 27, 2013

Related U.S. Application Data

(63) Continuation of application No. PCT/EP2011/064350, filed on Aug. 22, 2011.

(30) Foreign Application Priority Data

Aug. 23, 2010 (DE) .................. 10 2010 035 151

(51) Int. Cl.
*H01L 27/14* (2006.01)
*H01L 35/08* (2006.01)
*H01L 35/32* (2006.01)

(52) U.S. Cl.
CPC ............ *H01L 35/08* (2013.01); *H01L 35/32* (2013.01)

(58) Field of Classification Search
CPC .......... H01L 35/06; H01L 35/08; H01L 35/32
See application file for complete search history.

(56) References Cited

U.S. PATENT DOCUMENTS

| 3,054,840 A | 9/1962 | Alsing |
| 3,201,504 A | 8/1965 | Stevens |
| 3,261,079 A | 7/1966 | Clingman, Jr. et al. |

(Continued)

FOREIGN PATENT DOCUMENTS

| JP | H0936439 A | 2/1997 |
| SU | 169620 A1 | 6/1965 |
| TW | 200933941 A | 8/2009 |

OTHER PUBLICATIONS

International Search Report of PCT/EP2011/064350.

*Primary Examiner* — Victor A Mandala
(74) *Attorney, Agent, or Firm* — Laurence Greenberg; Werner Stemer; Ralph Locher

(57) ABSTRACT

A semiconductor element includes at least a thermoelectric material and a first frame part which are force-lockingly connected to one another, with the frame part forming a diffusion barrier for the thermoelectric material and an electrical conductor. A method for producing the semiconductor element as well as a thermoelectric module having at least two semiconductor elements, are also provided.

24 Claims, 4 Drawing Sheets

(56) References Cited

U.S. PATENT DOCUMENTS

| | | |
|---|---|---|
| 3,304,206 A | 2/1967 | Burdick et al. |
| 3,496,028 A | 2/1970 | Norton et al. |
| 3,547,706 A | 12/1970 | McGrew |
| 3,707,429 A * | 12/1972 | Saunders ................ H01L 35/08 136/205 |
| 3,859,143 A | 1/1975 | Krebs |
| 3,880,674 A * | 4/1975 | Saunders ................ H01L 35/08 136/237 |
| 3,988,171 A | 10/1976 | Miller et al. |
| 4,056,406 A | 11/1977 | Markman et al. |
| 4,828,627 A * | 5/1989 | Connery ................ H01L 35/32 136/203 |
| 5,429,680 A | 7/1995 | Fuschetti |
| 2008/0245397 A1* | 10/2008 | Moczygemba ......... H01L 35/32 136/201 |
| 2011/0023930 A1* | 2/2011 | Konig .................... H01L 35/34 136/212 |

* cited by examiner

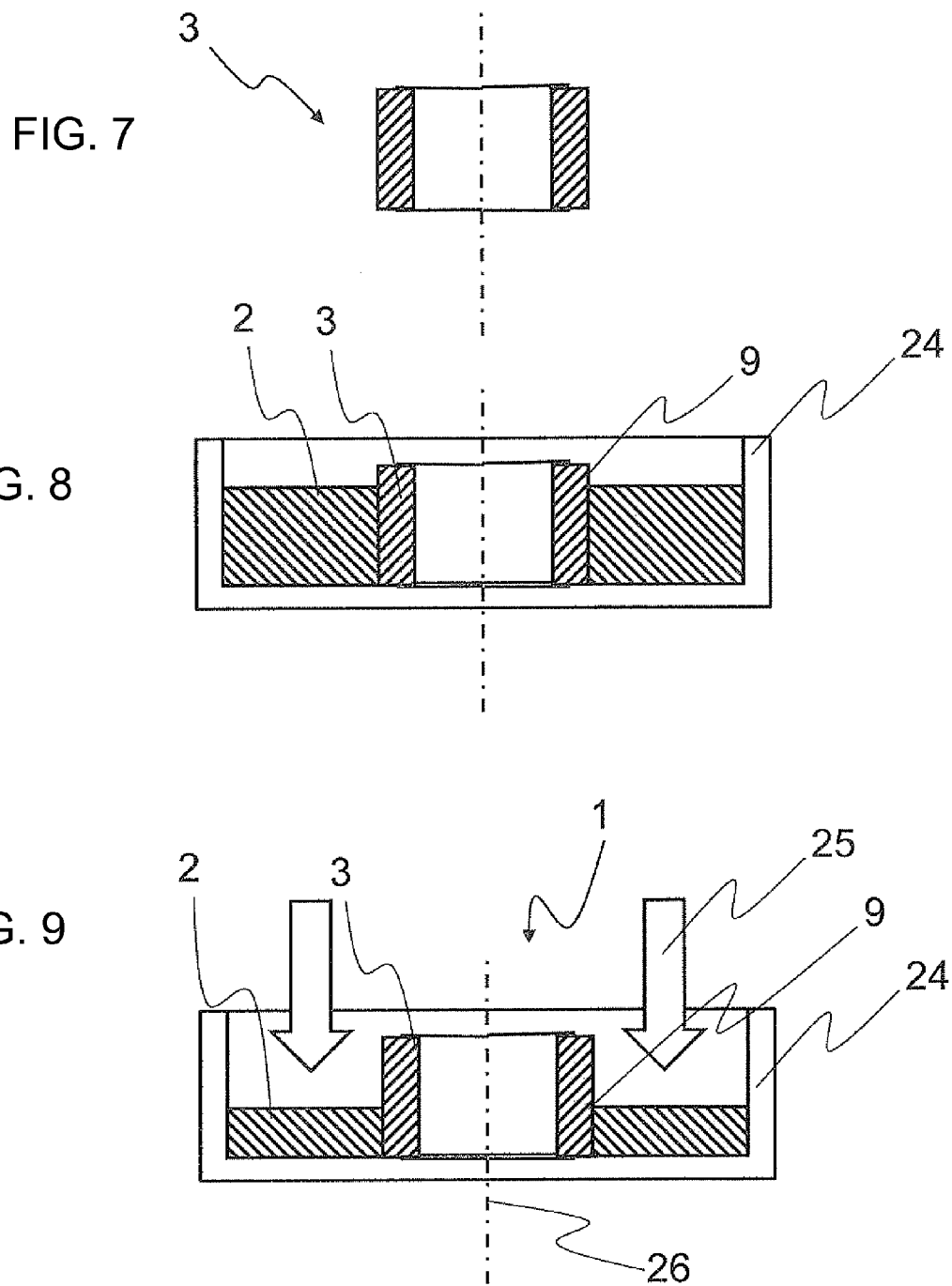

SEMICONDUCTOR ELEMENT FOR A THERMOELECTRIC MODULE, METHOD FOR PRODUCING THE SEMICONDUCTOR ELEMENT AND THERMOELECTRIC MODULE

CROSS-REFERENCE TO RELATED APPLICATION

This application is a continuation, under 35 U.S.C. §120, of copending International Application No. PCT/EP2011/064350, filed Aug. 22, 2011, which designated the United States; this application also claims the priority, under 35 U.S.C. §119, of German Patent Application DE 10 2010 035 151.2, filed Aug. 23, 2010; the prior applications are herewith incorporated by reference in their entirety.

BACKGROUND OF THE INVENTION

Field of the Invention

The present invention relates to a semiconductor element, a method for producing a semiconductor element and a thermoelectric module having such a semiconductor element or a semiconductor element produced by such a method.

The exhaust gas from an internal combustion engine of a motor vehicle contains thermal energy which can be converted into electric energy through the use of a thermoelectric generator in order, for example, to charge a battery or some other energy storage device and/or to feed the required energy directly to electric loads. In that way, the motor vehicle is operated with improved energy efficiency, and there is more energy available to operate the motor vehicle.

A thermoelectric generator of that kind has at least one thermoelectric module. Thermoelectric modules include, for example, at least two semiconductor elements (p-doped and n-doped), which are provided on the upper side and the lower side thereof (facing the hot side or the cold side) with alternate electrically conducting bridges and which form the smallest thermoelectric unit or a thermoelectric element. The nature of thermoelectric materials is such that they can convert thermal energy into electric energy in an effective manner (Seebeck effect) and vice versa (Peltier effect). If a temperature gradient is provided on both sides of the semiconductor elements, a voltage potential is formed between the ends of the semiconductor elements. The charge carriers on the hotter side are excited into the conduction band to an increased extent by the higher temperature. Due to the difference in concentration produced during that process in the conduction band, charge carriers diffuse to the colder side of the semiconductor element, giving rise to the potential difference. In a thermoelectric module, it is preferable if a large number of semiconductor elements is connected electrically in series. In order to ensure that the potential differences generated in the serial semiconductor elements do not cancel each other out, alternate semiconductor elements are always brought into direct electric contact with different majority charge carriers (n-doped and p-doped). Through the use of a connected load resistor, the circuit can be closed and thus electric power can be taken off.

In order to ensure that the semiconductor elements are fit for operation on a sustained basis, a diffusion barrier is generally disposed between the electrically conducting bridges and the thermoelectric material, preventing diffusion of material contained in the electric bridges into the thermoelectric material and hence preventing a loss of effectiveness or functional failure of the semiconductor material and of the thermoelectric element. The construction of thermoelectric modules and of the semiconductor elements is usually accomplished by assembling the individual components, namely the thermoelectric material, the diffusion barrier, the electrically conducting bridges, the insulation and, if appropriate, additional housing elements, to form a thermoelectric module, over which a hot or cold medium flows. That assembly of numerous individual components also requires precise matching of the individual component tolerances and allowance for the heat transfers from the hot to the cold side and adequate contacting of the electrically conducting bridges to enable a flow of current through the thermoelectric material to be produced.

SUMMARY OF THE INVENTION

It is accordingly an object of the invention to provide a semiconductor element for a thermoelectric module, a method for producing the semiconductor element and a thermoelectric module, which overcome the hereinafore-mentioned disadvantages and at least partially solve the highlighted problems of the heretofore-known elements, modules and methods of this general type. In particular, the intention is to specify a semiconductor element which is suitable for many and various uses and enables a thermoelectric module to be constructed in a way which is as simple and economical as possible. Moreover, the intention is to specify a simple method for producing a semiconductor element of this kind.

With the foregoing and other objects in view there is provided, in accordance with the invention, a semiconductor element, comprising at least a thermoelectric material and a first frame part connected force-lockingly to one another, the first frame part forming a diffusion barrier for the semiconductor element and an electric conductor. In this case, therefore, the semiconductor element represents the smallest structural unit and is already connected force-lockingly and in a captive manner to the first frame part. A force-locking connection is one which connects two elements together by force external to the elements, as opposed to a form-locking connection which is provided by the shapes of the elements themselves. In order to achieve this, the material of the first frame part is chosen so that a diffusion barrier is ensured and hence that the thermoelectric material is not contaminated by elements penetrating by diffusion and is not impaired in its effectiveness in terms of the conversion of thermal energy into electric energy. At the same time, the first frame part provides an electric conductor, thus also enabling the first frame part of a semiconductor element to be connected directly to adjacent semiconductor elements or to the first frame parts thereof and hence ensuring that an electric current produced by the thermoelectric module flows, in particular, exclusively through the frame parts and the semiconductor elements of the thermoelectric module. In particular, the semiconductor element and the first frame part are connected to one another at least partially in a form-locking manner or even materially.

The following materials, in particular, may be used as a thermoelectric material:

n-type: $Bi_2Te_3$; PbTe; $Ba_{0.3}Co_{3.95}Ni_{0.05}Sb_{12}$; $Ba_y(Co,Ni)_4Sb_{12}$; $CoSb_3$; $Ba_8Ga_{16}Ge_{30}$; $La_2Te_3$; SiGe; $Mg_2(Si,Sn)$;

p-type: $(Bi,Sb)_2TE_3$; $Zn_4Sb_3$; TAGS; PbTe; SnTe; $CeFe_4Sb_{12}$; $Yb_{14}MnSb_{11}$; SiGe; $Mg_2(Si,Sb)$.

In accordance with another particularly advantageous feature of the semiconductor element of the invention, a second frame part is provided for the semiconductor element and that frame part is disposed on an element surface of the thermoelectric material which lies opposite the element surface on which the first frame part is disposed. In this case, the thermoelectric material is embodied, in particular, in the form of a cylinder, cube, bar and/or circular ring segment, wherein the first frame part and the second frame part are disposed on mutually opposite element surfaces of the thermoelectric material. All statements concerning the first frame part also apply without restriction to the second frame part and vice versa.

In accordance with a further advantageous feature of the semiconductor element of the invention, the thermoelectric material, the first frame part and the second frame part are annular, the first frame part is disposed on an inner circumferential surface and the second frame part is disposed on an outer circumferential surface of the thermoelectric material. In particular, it is possible, with such an embodiment, to produce a tubular thermoelectric module in which the semiconductor elements are disposed in series and are each connected to one another electrically in alternation through the use of first frame parts and second frame parts.

In accordance with an added feature of the semiconductor element of the invention, at least the first frame part has two mutually opposite spaced surfaces, one of the surfaces is an attachment surface facing the thermoelectric material, the spacing between the surfaces defines a thickness of the first frame part and that thickness is 0.1 mm to 1 mm [millimeter], preferably 0.2 to 0.5 mm. In particular, the first frame parts and second frame parts spaced apart by the thermoelectric material are 1 to 5 mm [millimeters] apart, i.e. the material thickness of the thermoelectric material is 1 to 5 mm. If appropriate, the second frame part can be embodied in the same way.

An embodiment in which the second frame part is made of a material with a strength higher than the strength of the material from which the first frame part is made is furthermore preferred.

In accordance with an additional advantageous feature of the semiconductor element of the invention, at least the first frame part has two mutually opposite spaced contact surfaces, the spacing between which defines a first width. In this case, the first width is at least in part greater than a second width of the thermoelectric material, so that the first frame part projects on at least one side of the thermoelectric material. The contact surfaces mentioned herein are used, in particular, for making contact between adjacently disposed semiconductor elements through the frame parts thereof. The extent of the first frame part with a first width and of the thermoelectric material with a second width is viewed, in particular, in a parallel direction relative to one another, and therefore the definition that the first width is at least in part greater than the second width makes clear that the first frame part projects beyond the thermoelectric material on at least one side of the latter. In this case, it is preferred if the first frame part is disposed flush with the thermoelectric material on at least one side. As a very particularly preferred option, this (single) overlap is provided only over a small part of the extent of the first frame part, in particular only over 30% or even just 20% of the extent (in the circumferential direction). If appropriate, the second frame part can be embodied in the same way.

Provision can also be made for at least the first frame part to additionally project relative to the thermoelectric material on at least one further side. Such an embodiment is advantageous particularly when the first frame parts are connected by way of the contact surfaces, thus ensuring that there is no damage or contamination of the thermoelectric material in the case of welding, soldering, brazing or adhesive bonding of the contact surfaces of adjacently disposed semiconductor elements, which could prejudice the effectiveness of conversion of thermal energy into electric energy. If appropriate, the second frame part can be embodied in the same way.

It is furthermore possible, through the use of the defined overlap of the first frame part relative to the thermoelectric material, to influence the degree of filling of a thermoelectric module. In this case, the degree of filling determines the proportion of the thermoelectric material in an interspace or volume between a hot side and a cold side of a thermoelectric module, in which thermoelectric materials are disposed. It is preferred in this case if at least the first width is at least 130% of the second width, thus giving rise between two adjacently disposed thermoelectric materials to a gap amounting to at least 30% of the material thickness of the thermoelectric material in this direction. This can also be achieved (together) with the second frame parts.

In accordance with yet another advantageous feature of the semiconductor element of the invention, at least the first frame part has a coating which is disposed at least on the attachment surface facing the thermoelectric material. If appropriate, the second frame part can be embodied in the same way. This coating includes, in particular, a solder, a brazing material and/or a material for enlarging the joining surfaces of the thermoelectric material and the first/second frame part. In this case, it is necessary, in particular, for the solder or brazing material additionally to have the properties of a diffusion barrier since it is disposed between the thermoelectric material and the first/second frame part. The coating makes it possible to join the first/second frame part and the thermoelectric material and to make the connection or joint as strong as possible. In this way, it is also possible to improve or ensure the heat-conducting contact between the first/second frame part and the thermoelectric material, thus ensuring the effectiveness of the semiconductor element or of the thermoelectric module including a multiplicity of semiconductor elements. In accordance with yet a further feature of the semiconductor element of the invention, a coating used for this purpose includes solder or brazing material, in particular. The solder or brazing material is, in particular, a lead-containing solder or brazing material, preferably with a lead content of 90% by weight or above.

In accordance with yet an added feature of the semiconductor element of the invention, at least on the attachment surface facing the thermoelectric material, at least the first frame part has, at least in part, a surface structure which includes at least one of the following elements:

a groove,
an offset,
a raised portion, or
a roughness Rz of at least 12 μm.

Due to this surface structure, there is, in particular, form-locking engagement of thermoelectric material through the at least one element with the first frame part. Through the use of the element, the connection or joint between the thermoelectric material and the first frame part is improved with regard to the strength of the connection or joint. If appropriate, the second frame part can be embodied in the same way.

In this case, a groove includes a depression within the first frame part, which is distinguished from an offset inasmuch as, in the case of an (encircling) offset, the depression extends as far as a contact surface, and therefore the first frame part could be pushed onto a thermoelectric material. In contrast to the groove and the offset, the raised portion indicated herein is a continuation of the frame part which extends into the thermoelectric material and thus allows form-locking engagement between the thermoelectric material and the first frame part.

The roughness Rz defined herein is generally determined in accordance with DIN 4768, with the value in this case being at least 12 μm [micrometers], in particular at least 20 μm, thus ensuring a large surface for joining the thermoelectric material and the first frame part.

In accordance with yet an additional advantageous feature of the semiconductor element of the invention, at least the first frame part is composed of at least 95% by weight of nickel or molybdenum. On one hand, these materials ensure that the first frame part forms a reliable diffusion barrier with respect to the thermoelectric material and furthermore that it is suitable for implementing an electric conductor. In particular, provision is made in this case for the first frame part to be composed of at least 99% by weight of nickel or molybdenum. If appropriate, the second frame part can be embodied in the same way.

With the objects of the invention in view, there is also provided a method for producing a semiconductor element, comprising at least the following steps:
a) providing at least one first frame part;
b) placing a thermoelectric material on an attachment surface of the first frame part; and
c) compressing at least the first frame part and the thermoelectric material, causing the two components to enter into a force-locking connection.

The method is particularly suitable for producing a semiconductor element described herein according to the invention.

The individual steps are generally carried out in the order given in this case, and it is possible, where appropriate, to produce a plurality of semiconductor elements jointly. With respect to the method, it should be noted that it is also possible, where appropriate, to provide a second frame part in step a), in which case the thermoelectric material is then disposed between the attachment surfaces of both frame parts in step b), and is then compressed therewith.

In accordance with another particularly advantageous mode of the method of the invention, the thermoelectric material is pulverulent or has already been precompressed in step b).

An embodiment of the method in which the precompressed slug has a porosity of 20% or less, preferably a porosity of 10% or less, and particularly preferably a porosity of 5% or less, is preferred.

Due to the compression of at least the first frame part (and, if appropriate, the second frame part) and the thermoelectric material, at least a force-locking connection or joint is produced. In particular, additional elements, such as a groove, an offset, a raised portion and/or increased roughness of the first/second frame part, can also be used to achieve a form-locking connection or joint. A material connection or joint is likewise possible, in particular as an additional measure, and is achieved through the use of a coating between the first/second frame part and the thermoelectric material, in particular by using a soldering material or brazing material. Through the use of compression, the thermoelectric material, in particular, is further compacted and flows in the direction of the first frame part, with the result that the elements provided can be fully filled so as to increase the strength of the connection or joint between at least the first frame part and the thermoelectric material.

A process in which the compressed elements, that is to say, in particular, the first frame part and the thermoelectric material, have a porosity of 10% or less, in particular 5% or less, and particularly preferably 3% or less, after compression is particularly preferred. Compression is preferably controlled through the use of the process parameters of compression pressure, compression time and/or compression temperature.

As a preferred option, the method step of compression can be divided into a plurality of component operations.

In accordance with another advantageous mode of the method of the invention, step c) is carried out at a temperature of at least 20° C. A temperature of at least 150° C., particularly preferably greater than 250° C., is particularly preferred but, in particular, the temperature should not exceed 800° C. or alternatively 400° C. Particularly for the materials PbTE and BiTe, a temperature of at least 150° C. and no more than 400° C. has proven particularly advantageous. A process in which the temperature is held in a temperature range of 30 to 80% of the maximum thermal stability of the thermoelectric material is preferred. Maximum thermal stability is taken to be the temperature to which the thermoelectric material can be heated while still maintaining the thermoelectric properties of the material.

Heating in step c) is preferably accomplished inductively, with the process being controlled in such a way that the current couples-in approximately at the depth of the boundary layer between the thermoelectric material and the first and/or second frame part, in particular through an appropriate choice of the frequency of excitation, so that the coupling-in of energy takes place at an appropriate depth.

As a preferred option, any transfer resistance due to the boundary layer and/or an imperfect material connection or joint can be reduced and/or the adhesion between the frame part and the thermoelectric material can be improved by heating the boundary layer between the thermoelectric material and the frame part and, in particular, by using a coating in this area, e.g. a coating of solder or brazing material.

At such temperatures, it is also possible to join a precompressed thermoelectric material to at least the first frame part by plastic flow. It is thus possible, in a particularly advantageous manner, to implement a sintering process which allows a high connection or joint strength between the thermoelectric material and the first frame part merely by force-locking connection. In particular, this connection or joint between the thermoelectric material and the first frame part is gap-free, ensuring that heat transfer and electric current transfer is not impaired.

With the objects of the invention in view, there is concomitantly provided a thermoelectric module, comprising at least two semiconductor elements according to the invention or being produced by the method according to the invention. The semiconductor elements are disposed adjacent one another in the thermoelectric module in such a way that frame parts of adjacent semiconductor elements are in contact and are connected to one another materially at this contact location. In particular, these contact locations are in each case embodied in such a way as to be either electrically conductive or electrically insulating, thus providing appropriate electrical interconnection of the individual semiconductor elements.

Of course, it is also possible for semiconductor elements of both embodiments to be combined together in an appropriate manner in one thermoelectric module. It is likewise possible for contact to be made with first frame parts and/or second frame parts.

Through the provision of semiconductor elements of this kind, which are connected directly through the use of frame parts, the previously complex and costly production process for a thermoelectric module has been significantly simplified. In particular, the very sensitive thermoelectric materials are protected from external influences by placement between a first frame part and a second frame part and can be handled accordingly. In this case, the frame parts of adjacent semiconductor elements are connected to one another in such a way that a flow of electric current through adjacently disposed semiconductor elements can be produced. In particular, the configuration is implemented in such a way that n-doped and p-doped semiconductor elements are disposed alternately in series, with the element surfaces thereof which are assigned respectively to a hot side and a cold side being connected electrically to one another in alternation.

In accordance with another advantageous feature of the thermoelectric module of the invention, frame parts of adjacent semiconductor elements are in each case in contact at a contact surface and are connected to one another materially at this contact surface. In particular, an embodiment of this kind is used to implement a butt connection or joint between the adjacently disposed semiconductor elements, enabling them to be welded, soldered, brazed or adhesively bonded to one another in a particularly simple manner. As an alternative or in addition, frame parts of adjacent semiconductor elements are in each case in contact at a contact surface and are connected to one another elastically at this contact location, in particular through the use of appropriate vulcanization and/or rubberization.

The formation of a material connection or joint between adjacently disposed semiconductor elements can preferably be performed by welding, in particular by laser welding.

In accordance with a further feature of the thermoelectric module of the invention, at least a first frame part on the thermoelectric module forms a compensation element, with the result that semiconductor elements disposed adjacent one another can be moved relative to one another in at least one plane. This compensation element can be provided in the form of a resilient structure, for example, which is formed at least through the use of the first frame part. The material connection or joint between the frame parts of adjacent semiconductor elements thus forms compensation elements which compensate for an increase, for example, in the axial length of a hot side relative to a cold side and/or a displacement of the semiconductor elements relative to one another in a circumferential direction and/or in a radial direction. Of course, the second frame part can be embodied in the same way.

In accordance with a concomitant advantageous feature of the thermoelectric module of the invention, at least a first frame part is connected directly in a thermally conductive manner to a hot medium, or at least a second frame part is connected in a thermally conductive manner only through an electric insulation to a cold medium. It is likewise possible for both features to be provided together.

In this case, it is the exhaust gas of an internal combustion engine, in particular, which is regarded as a hot medium which flows over a thermoelectric module. In particular, the surface of the thermoelectric module which faces the exhaust gas is formed at least by a plurality of first frame parts. The first frame parts are connected to one another materially in an electrically conductive manner. However, the semiconductor elements are also embodied so as to be insulated electrically from one another in alternation, with the result that the electric current is passed alternately from a hot side to a cold side through n-doped and p-doped semiconductor elements. In this case, the first frame parts assume the function of the diffusion barrier with respect to the thermoelectric material. Moreover, the first frame parts produce an electric current path along the thermoelectric module and, at the same time, form the outer surface of the thermoelectric module, which is intended to allow heat transfer from a hot medium to the semiconductor elements with as little loss as possible. Since the at least first frame parts thus form the housing of the thermoelectric module on the hot side, it is possible to dispense in this case with an electric insulation of the electrically conductive first frame parts relative to the exhaust gas. The remaining structure of the housing, the electric insulation, the electrically conductive current paths, the diffusion barrier and the thermoelectric material is thereby significantly simplified. In particular, the adjacently disposed semiconductor elements can have electric insulation elements on the mutually facing contact surfaces thereof, with the insulation elements enabling the thermoelectric module to be sealed off from the exhaust gas and, on the other hand, for the first frame parts to be electrically insulated from one another.

In a corresponding manner, there is also a proposal for second frame parts which, in particular, delimit the thermoelectric module with respect to a cold medium. In this case, the cold medium is, in particular, a liquid. An electric insulation should simultaneously allow good heat conduction, thus ensuring that the efficiency of the thermoelectric module with respect to the conversion of thermal energy contained in the exhaust gas into electric energy is not restricted. A film, for example, is provided as an electric insulation, since it is a simple matter to apply the film to the corresponding surface of the thermoelectric module. As an alternative or in addition, a heat-shrinkable sleeve, in particular such a sleeve on the side of the second frame parts which faces the cold medium, can be proposed as an electric insulation. An electric insulation can be applied to the frame parts on the outside and/or the inside, in particular on the outside, preferably in those regions of the frame parts which form the outer surface of the thermoelectric module.

In such an embodiment of the thermoelectric module, the first and/or second frame parts, in particular, which are each embodied, in particular, with compensation elements, simultaneously form enlarged heat transfer surfaces. These enlarged heat transfer surfaces are achieved, in particular, by the frame parts, which are connected to one another by contact surfaces, projecting at least partially into the exhaust gas flow and into the cold medium. As a result, on one hand, turbulence is produced in the exhaust gas and the cold medium, resulting in improved heat transfer, and, at the same time, good mixing of the exhaust gas or of the cold medium is achieved, ensuring that the temperature level at the thermoelectric module is as uniform as possible.

The semiconductor elements and thermoelectric modules proposed herein are suitable, in particular, for thermoelectric generators which are used for motor vehicles and which are intended to convert the thermal energy of an exhaust gas from an internal combustion engine into electric energy.

Other features which are considered as characteristic for the invention are set forth in the appended claims, noting that the features presented individually in the claims can be combined in any technologically meaningful way and give rise to additional embodiments of the invention. Advantageous embodiments of the semiconductor element according to the invention and the integration of the semiconductor element into higher-level subassemblies and the method for producing same are indicated in the dependent claims.

Although the invention is illustrated and described herein as embodied in a semiconductor element for a thermoelectric module, a method for producing the semiconductor element and a thermoelectric module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 7 is a longitudinal-sectional view illustrating method step a) for producing a semiconductor element;

FIG. 8 is a longitudinal-sectional view illustrating step b) of the method for producing a semiconductor element; and FIG. 9 is a longitudinal-sectional view illustrating step c) for producing a semiconductor element.

DETAILED DESCRIPTION OF THE INVENTION

Figure 1:
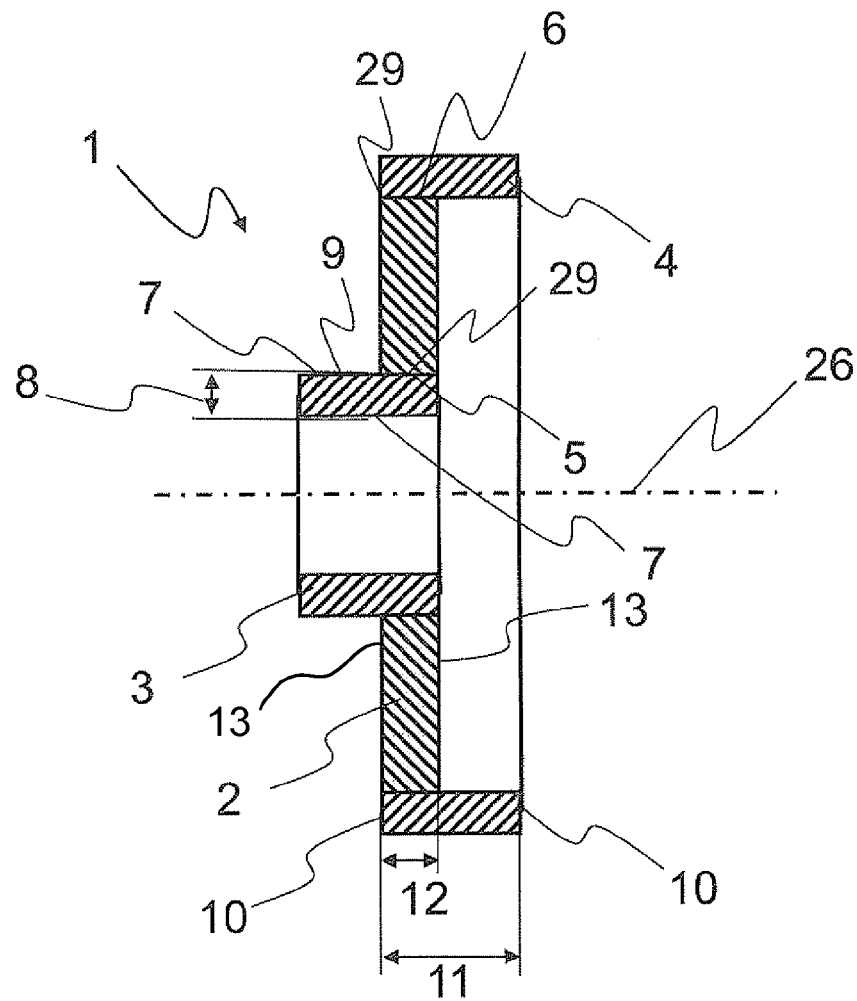
FIG. 1 is a diagrammatic, longitudinal-sectional view of a semiconductor element.

Referring now to the figures of the drawings in detail and first, particularly, to FIG. 1 thereof, there is seen an annular semiconductor element 1 having a thermoelectric material 2 and a first frame part 3, which is disposed on an inner circumferential surface 5 of the thermoelectric material 2. A second frame part 4 is disposed on an outer circumferential surface 6 of the thermoelectric material 2. Even if the term "first frame part" is used herein for the inner frame part and the term "second frame part" is used for the outer frame part, such a designation is not obligatory for other variant embodiments of the invention.

The outer circumferential surface 6 is an element surface 29 of the thermoelectric material 2 which lies opposite an element surface 29 of the thermoelectric material 2 at which the thermoelectric material 2 is connected to the first frame part 3. The first frame part 3 has two opposite surfaces 7. An attachment surface 9 is formed on the surface 7 situated opposite the thermoelectric material 2. A thickness 8 of the first frame part 3 is formed between the opposite surfaces 7. The second frame part 4 has two mutually opposite contact surfaces 10, between which a first width 11 of the second frame part 4 extends. In a corresponding parallel direction, the thermoelectric material 2 has a second width 12, which in this case is less than the first width 11. The first frame part 3 accordingly projects in the direction of a center line 26 beyond the thermoelectric material 2 on a side 13 of the thermoelectric material 2. A corresponding overlap beyond the thermoelectric material 2 is also formed at the first frame part 3 in the opposite direction with respect to the second frame part 4, in the direction of the center line 26.

Figure 2:
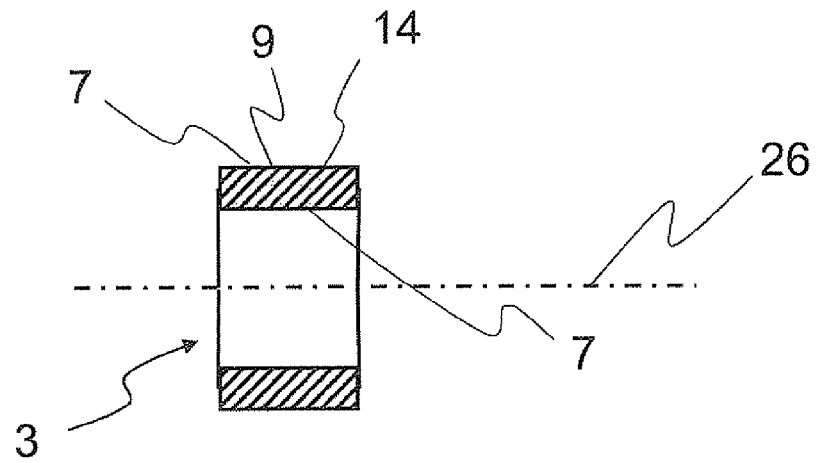
FIG. 2 is a longitudinal-sectional view of a first frame part.

FIG. 2 shows an annular first frame part 3 with two mutually opposite surfaces 7, wherein the outer surface 7 in this case forms an attachment surface 9 for attachment of the first frame part 3 to the thermoelectric material 2. In order to increase the strength of the connection or joint between the first frame part 3 and the thermoelectric material 2, a coating 14 is provided. The coating 14 is applied to the attachment surface 9.

Figure 3:
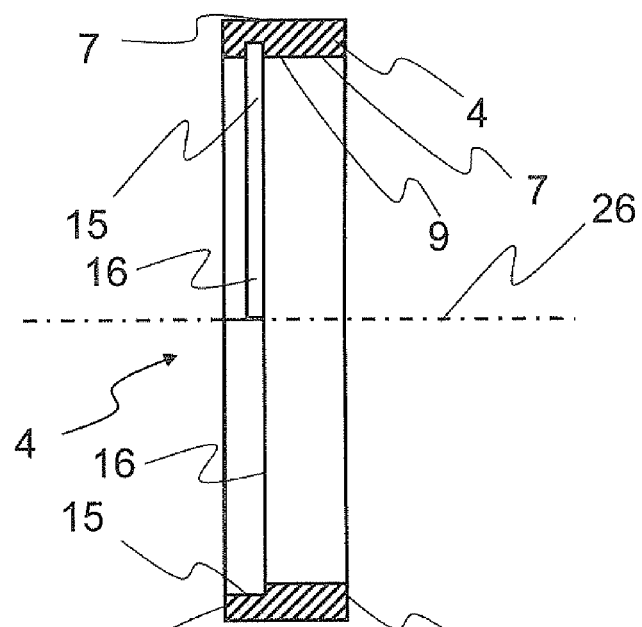
FIG. 3 is a longitudinal-sectional view of a second frame part.

FIG. 3 shows a second frame part 4 with corresponding mutually opposite surfaces 7, wherein the inner circumferential surface of the annular second frame part 4 in this case has the attachment surface 9 for attaching the second frame part 4 to the thermoelectric material 2. An element 16, in this case embodied as a groove, is shown as a surface structure 15 on the attachment surface 9 in the upper part of FIG. 3. The thermoelectric material 2 extends into the groove, ensuring that it is fixed within the annular second frame part 4, at least in the direction of the center line 26. In this case, the thermoelectric material can extend in the direction of the center line 26 on both sides of the groove within the second frame part 4. In the lower half of FIG. 3, the surface structure 15 is formed by the element 16, which in this case is shown as an offset, that enables the thermoelectric material to be fixed at least in one direction of the center line 26. The thermoelectric material is disposed between the annular attachment surface 9 and the lateral contact surfaces 10.

Figure 4:
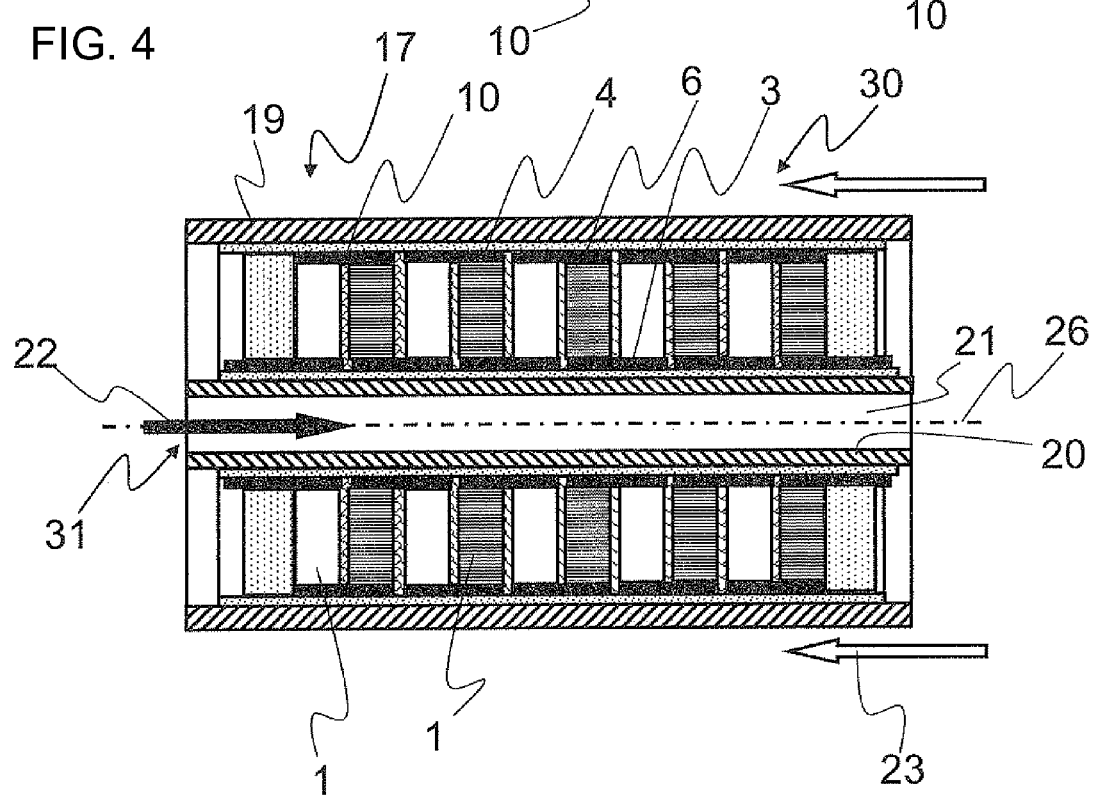
FIG. 4 is a longitudinal-sectional view of a thermoelectric module.

FIG. 4 shows a thermoelectric module 17 having a multiplicity of semiconductor elements 1. These semiconductor elements 1 are disposed annularly around an inner tube 20 and are surrounded by an outer tube 19 on an outer circumferential surface 6. The inner tube 20 forms a duct 21, through which a hot medium 22 flows along the center line 26. A cold medium 23 flows over the thermoelectric module 17 on an outer circumferential surface of the outer tube 19. A temperature potential is thereby formed between the outer tube 19 and the inner tube 20, making it possible for the thermoelectric module 17 to produce an electric current due to the thermoelectric effect using the semiconductor elements 1, which are connected electrically to one another in alternation on a cold side 30 and a hot side 31. The second frame part 4 and the first frame part 3 are connected to one another in an electrically conductive manner at the contact surfaces 10.

Figure 5:
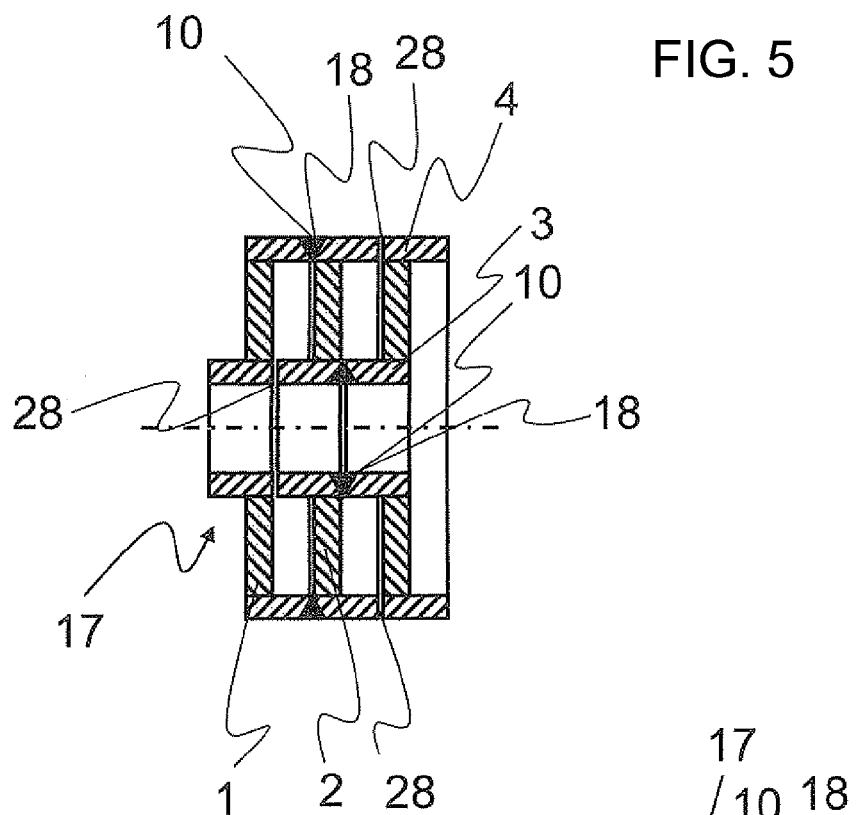
FIG. 5 is a longitudinal-sectional view of a first configuration of semiconductor elements.

FIG. 5 shows a first configuration of semiconductor elements 1 to form a thermoelectric module 17. The semiconductor elements 1, which in this case are constructed in a manner corresponding to FIG. 1, are connected to one another materially in alternation through the first frame parts 3 and the second frame parts 4 at contact surfaces 10, thereby forming respective contact locations 18. In a corresponding manner, electric insulations 28 are provided alternately between each of the adjacent first frame parts 3 and each of the adjacent second frame parts 4, thereby producing a corresponding current path through the thermoelectric module 17.

Figure 6:
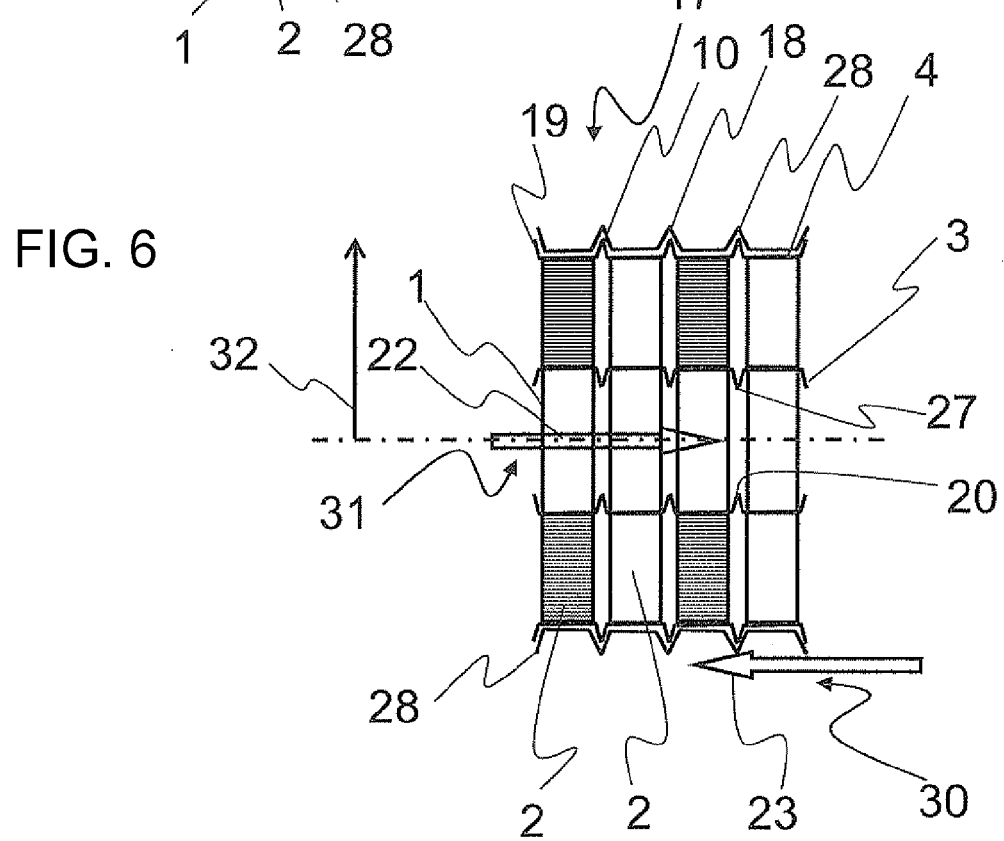
FIG. 6 is a longitudinal-sectional view of a second configuration of semiconductor elements.

FIG. 6 shows a second configuration of semiconductor elements 1 to form a thermoelectric module 17. In this case, n-doped and p-doped thermoelectric materials 2 are connected to one another in an electrically conductive manner, through the contact surfaces 10, by the first frame parts 3 and the second frame parts 4 or are insulated from one another at the contact surfaces 10. The touching contact surfaces 10 thus form respective contact locations 18. In this case, a cold medium 23 flows directly over the thermoelectric module 17 on the outer surface of the thermoelectric module 17, which is formed by the second frame parts 4. The second frame parts 4 which are constructed to run around in a ring shape and project outward in a radial direction, are connected to one another alternately in an electrically conductive or electrically insulated manner at contact surfaces 10 and thus form a complete outer tube 19. The inner tube 20 is formed in a corresponding manner on the inside of the thermoelectric module 17 by the first frame parts 3 and carries a flow of a hot medium 22. Since the hot medium 22 is generally an exhaust gas, it is possible to dispense with an electric insulation of the first frame parts 3 with respect to the exhaust gas on the hot side 31. When using an electrically conductive cold medium 23, an electric insulation 28 is required on the cold side 30 and is applied to the outside of the second frame parts 4. This insulation can be constructed as a heat-shrinkable sleeve, for example. The outwardly-projecting and inwardly-projecting frame parts 3, 4 form compensation elements 27, allowing thermal expansion of the thermoelectric module 17 in the direction of the center line 26. At the same time, a displacement of the semiconductor elements 1 relative to one another in a radial direction 32 is also made possible.

FIG. 7 shows a method step a) for producing a semiconductor element, wherein a first frame part 3 is provided.

FIG. 8 shows a step b) of the method for producing a semiconductor element, wherein a thermoelectric material 2 is disposed on the attachment surface 9 of the first frame part 3. For this purpose, the first frame part 3 and the thermoelectric material 2 are disposed in a mold 24.

FIG. 9 shows a step c) for producing a semiconductor element 1, wherein the thermoelectric material 2 disposed in the mold 24 is compacted by a ram 25, which can be moved in the direction of the center line 26 and is connected at least force-lockingly to the first frame part 3 by virtue of the pressure applied. During this process, heat can additionally be introduced into the compression process, with the result that even a thermoelectric material 2 which has already been precompressed begins to flow plastically and is connected at least force-lockingly to the first frame part 3 by way of the attachment surface 9. The compression of the thermoelectric material 2 and the first frame part 3 makes possible a gap-free connection of these components to form a semiconductor element 1.

Through the use of the invention presented herein, the problems described with respect to the prior art have been at least partially solved. In particular, a semiconductor element has been specified which is suitable for many and various uses and which enables a thermoelectric module to be constructed in a way which is as simple and economical as possible. Moreover, a simple method for producing a semiconductor element of this kind has been specified.

The invention claimed is:

1. A semiconductor element, comprising:
   a thermoelectric material and a first frame part being force-lockingly connected to one another;
   said first frame part having two mutually opposite circumferential surfaces spaced apart by a spacing defining a thickness of said first frame part, and one of said circumferential surfaces being an attachment surface facing said thermoelectric material, said first frame part forming a diffusion barrier for said thermoelectric material and an electric conductor.

2. The semiconductor element according to claim 1, wherein:
   said thermoelectric material has two oppositely-disposed element surfaces;
   a second frame part is disposed on one of said element surfaces; and
   said first frame part is disposed on the other of said element surfaces.

3. A thermoelectric module, comprising:
   at least two semiconductor elements according to claim 2, said semiconductor elements disposed adjacent one another with said first frame parts of adjacent thermoelectric elements in contact with and connected to one another materially at respective contact locations and said second frame parts of adjacent thermoelectric elements in contact with and connected to one another materially at respective contact locations.

4. The thermoelectric module according to claim 3, wherein said first frame parts of said adjacent semiconductor elements are in contact at respective contact surfaces and are connected to one another materially at said contact surfaces.

5. The thermoelectric module according to claim 3, wherein at least said first frame parts form a compensation element allowing said semiconductor elements disposed adjacent one another to be moved relative to one another in at least one plane.

6. The thermoelectric module according to claim 3, wherein at least said first frame parts communicate directly in a thermally conductive manner with a hot medium, or at least said second frame parts communicate in a thermally conductive manner only through an electric insulation with a cold medium.

7. The semiconductor element according to claim 2, wherein:
   said thermoelectric material, said first frame part and said second frame part are annular;
   said thermoelectric material has an inner circumferential surface and an outer circumferential surface; and
   said first frame part is disposed on said inner circumferential surface and said second frame part is disposed on said outer circumferential surface.

8. The semiconductor element according to claim 1, wherein said thickness is 0.1 mm to 1 mm.

9. The semiconductor element according to claim 1, further comprising a coating disposed at least on said attachment surface.

10. The semiconductor element according to claim 9, wherein said coating includes a solder material.

11. The semiconductor element according to claim 1, wherein:
    said first frame part at least partly has a surface structure on said attachment surface; and
    said surface structure includes at least one element selected from the group consisting of:
    a groove,
    an offset,
    a raised portion, and
    a roughness of at least 12 μm.

12. The semiconductor element according to claim 1, wherein at least said first frame part is composed of at least 95% by weight of nickel or molybdenum.

13. A thermoelectric module, comprising:
    at least two semiconductor elements according to claim 1, said semiconductor elements disposed adjacent one another with said first frame parts of adjacent thermoelectric elements in contact with and connected to one another materially at respective contact locations.

14. The thermoelectric module according to claim 13, wherein said first frame parts of said adjacent semiconductor elements are in contact at respective contact surfaces and are connected to one another materially at said contact surfaces.

15. The thermoelectric module according to claim 13, wherein at least said first frame parts form a compensation element allowing said semiconductor elements disposed adjacent one another to be moved relative to one another in at least one plane.

16. The thermoelectric module according to claim 13, wherein at least said first frame parts communicate directly in a thermally conductive manner with a hot medium.

17. A semiconductor element, comprising:
    a thermoelectric material and a first frame part being force-lockingly connected to one another;
    said first frame part forming a diffusion barrier for said thermoelectric material and an electric conductor,
    said first frame part having two mutually opposite contact surfaces spaced apart by a spacing defining a first width;

said thermoelectric material having a second width; and said first width being at least in part greater than said second width causing said first frame part to project on at least one side of said thermoelectric material.

18. A method for producing a semiconductor element, the method comprising the following steps:
   a) providing at least one first frame part having two mutually opposite circumferential surfaces spaced apart by a spacing defining a thickness of said first frame part, and one of said circumferential surfaces being an attachment surface;
   b) placing a thermoelectric material on the attachment surface; and
   c) compressing at least the first frame part and the thermoelectric material producing a force-locking connection therebetween.

19. The method according to claim 18, which further comprises providing the thermoelectric material in step b) as a pulverulent or precompressed material.

20. The method according to claim 18, which further comprises carrying out step c) at a temperature of at least 20° C.

21. A thermoelectric module, comprising:
   at least two semiconductor elements produced by the method according to claim 10, the semiconductor elements disposed adjacent one another with the first frame parts of adjacent thermoelectric elements in contact with and connected to one another materially at respective contact locations.

22. The thermoelectric module according to claim 21, wherein the first frame parts of the adjacent semiconductor elements are in contact at respective contact surfaces and are connected to one another materially at the contact surfaces.

23. The thermoelectric module according to claim 21, wherein at least the first frame parts form a compensation element allowing the semiconductor elements disposed adjacent one another to be moved relative to one another in at least one plane.

24. The thermoelectric module according to claim 21, wherein at least the first frame parts communicate directly in a thermally conductive manner with a hot medium.

* * * * *